(12) United States Patent
Suzuki et al.

(10) Patent No.: US 8,799,748 B2
(45) Date of Patent: Aug. 5, 2014

(54) NON-VOLATILE SEMICONDUCTOR MEMORY DEVICE PERFORMING MULTI-LEVEL STORAGE OPERATION

(75) Inventors: Toshihiko Suzuki, Kawasaki (JP);
Hidenori Takahashi, Yokohama (JP);
Terumasa Haneda, Machida (JP);
Atsushi Uchida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 67 days.

(21) Appl. No.: 13/537,350

(22) Filed: Jun. 29, 2012

(65) Prior Publication Data

US 2013/0042164 A1    Feb. 14, 2013

(30) Foreign Application Priority Data

Aug. 11, 2011 (JP) ................... 2011-176166

(51) Int. Cl.
*G11C 29/00* (2006.01)
*G06F 11/10* (2006.01)
(52) U.S. Cl.
CPC ............... *G06F 11/1072* (2013.01)
USPC ........................... 714/773; 714/763
(58) Field of Classification Search
USPC ............... 714/773, 763, 752, 746
See application file for complete search history.

(56) References Cited

U.S. PATENT DOCUMENTS

| | | | | |
|---|---|---|---|---|
| 5,511,078 A | * | 4/1996 | Barucchi et al. | 714/763 |
| 8,254,170 B2 | * | 8/2012 | Eli et al. | 365/185.09 |
| 2008/0112222 A1 | | 5/2008 | Shirakawa | |
| 2010/0229035 A1 | * | 9/2010 | Kohler et al. | 714/15 |
| 2011/0231738 A1 | * | 9/2011 | Horisaki | 714/773 |

FOREIGN PATENT DOCUMENTS

| | | |
|---|---|---|
| JP | 2000-298992 | 10/2000 |
| JP | 2008-123330 | 5/2008 |

* cited by examiner

*Primary Examiner* — Sam Rizk
*Assistant Examiner* — Christian Dorman
(74) *Attorney, Agent, or Firm* — Staas & Halsey LLP

(57) ABSTRACT

A non-volatile semiconductor memory device includes: a memory unit including a plurality of memory cells, each of the plurality of memory cells to perform a multi-level storage operation by assigning a value including a plurality of bits to at least four data states defined according to a threshold level; and a controller to control the memory unit, wherein the controller sets at least one of the plurality of bits to an error correction bit that indicates one of a first state and a second state; assigns the first state to the error correction bits that correspond to the data states having a minimum threshold level and a maximum threshold level and the second state to the error correction bits that correspond to the data state having other threshold level; and resets the error correction bit to the first state when the error correction bit indicates the second state.

10 Claims, 10 Drawing Sheets

FIG. 6A

| LOGICAL ADDRESS | PAGE ADDRESS |
|---|---|
| (LA1)-(LA1+7) | (PA1)-(PA1+15) |
| (LA2)-(LA2+7) | (PA2)-(PA2+15) |

| LOGICAL ADDRESS | FIRST PAGE ADDRESS | SECOND PAGE ADDRESS |
|---|---|---|
| LA1 | PA1+1 | PA1 |
| LA1+1 | PA1+3 | PA1+2 |
| LA1+2 | PA1+5 | PA1+4 |
| LA1+3 | PA1+7 | PA1+6 |
| ⋮ | ⋮ | ⋮ |
| LA1+7 | PA1+15 | PA1+14 |

⋮ ⋮ ⋮

NON-VOLATILE SEMICONDUCTOR MEMORY DEVICE PERFORMING MULTI-LEVEL STORAGE OPERATION

CROSS-REFERENCE TO RELATED APPLICATION(S)

This application is based upon and claims the benefit of priority of the prior Japanese Patent Application No. 2011-176166, filed on Aug. 11, 2011, the entire contents of which are incorporated herein by reference.

FIELD

The embodiments discussed herein are related to a non-volatile semiconductor memory device.

BACKGROUND

In NAND flash memories, bit errors occur due to read-disturb, program-disturb, or data retention, etc. Compared to the error bits occurred in the NAND flash memories, NOR flash memories may have less error bits. To correct the bit errors, error correction codes (ECC) are used.

Miniaturization of non-volatile semiconductor memory devices or adoption of multi-level storage technology therein may cause bit errors. Thus the number of error correction bits for ECC may increase. An increase in the number of error correction bits may cause an expansion of an ECC circuit and an increase in time for coding and decoding of ECC.

Related art is disclosed in Japanese Laid-open Patent Publication No. 2008-123330, Japanese Laid-open Patent Publication No. 2000-298992, etc.

SUMMARY

According to one aspect of the embodiments, a non-volatile semiconductor memory device includes: a memory unit including a plurality of memory cells, each of the plurality of memory cells to perform a multi-level storage operation by assigning a value including a plurality of bits to at least four data states defined according to a threshold level; and a controller to control the memory unit, wherein the controller sets at least one of the plurality of bits to an error correction bit that indicates one of a first state and a second state; assigns the first state to the error correction bits that correspond to the data states having a minimum threshold level and a maximum threshold level and the second state to the error correction bits that correspond to the data state having other threshold level; and resets the error correction bit to the first state when the error correction bit indicates the second state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 6A and 6B illustrate an exemplary address mapping.

DESCRIPTION OF EMBODIMENTS

In order to increase reliability of such non-volatile semiconductor memory devices performing multi-level storage operation, the number of memory bits per cell may be reduced when the number of posteriori failures exceeds a threshold. Furthermore, a conversion of one-bit data to two-bit data may be performed when writing and a reverse of the conversion from the two-bit data to the one-bit data may be performed when reading.

FIGS. 1A-1D illustrate an exemplary non-volatile semiconductor memory device. Memory cells of the non-volatile semiconductor memory device include floating gate FETs. For example, one memory cell may store four-valued data.

Figure 1:
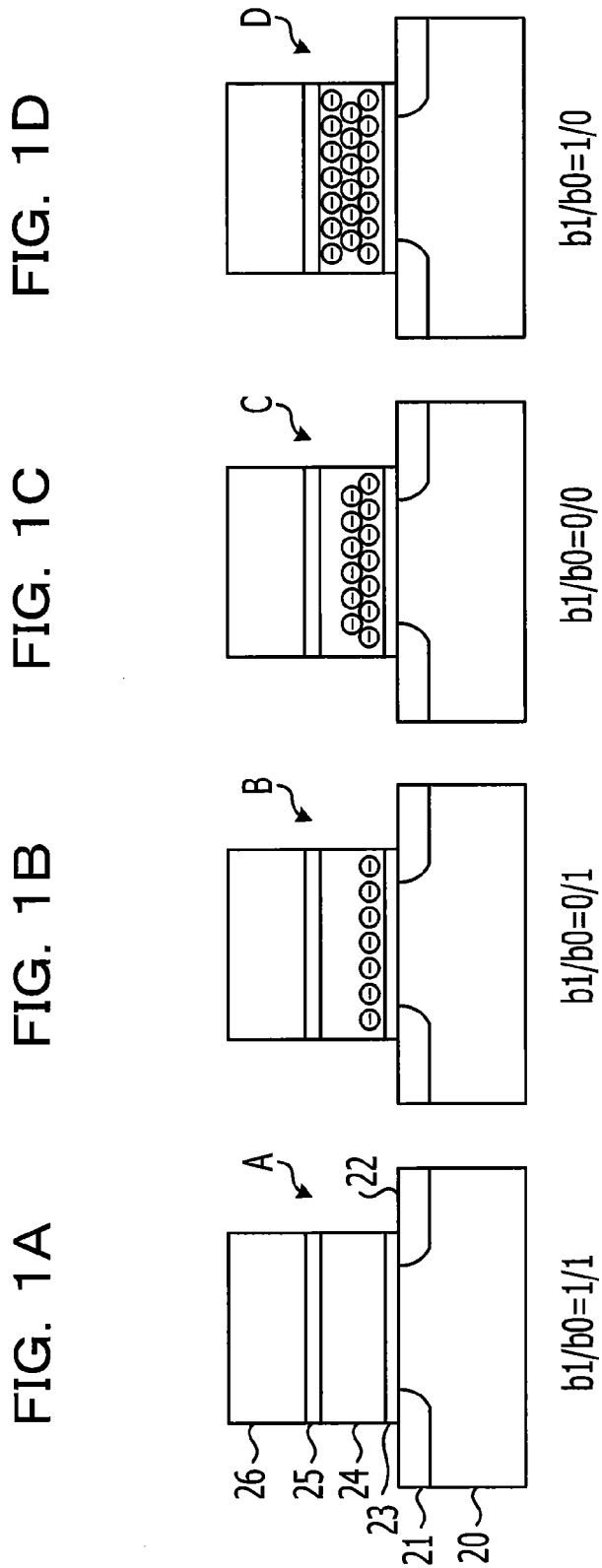
FIGS. 1A-1D illustrate an exemplary non-volatile semiconductor memory device.

As illustrated in FIG. 1A, layers of a gate insulation film 23, a floating gate 24, a middle insulation film 25, and a control gate 26 are sequentially formed on a semiconductor substrate 20. A source 21 and a drain 22 are formed at a top part of the semiconductor substrate 20 on both sides of the layered structure. A threshold voltage (hereinafter referred to as "threshold") for turning on the floating gate FET is dependent on an amount of electrical charge stored in the floating gate 24. The non-volatile semiconductor memory device illustrated in FIG. 1A stores four-valued data, by associating each value of the four-valued data to one of four different states of a stored amount of electrical charge (or threshold level).

FIG. 1A illustrates a state where no electrical charge is stored in the floating gate 23, for example, an erased state. FIG. 1B, FIG. 1C, and FIG. 1D illustrate states where a less amount, a middle amount, and a larger amount of electrical charge are stored in the floating gate 23, respectively. The states of FIG. 1A, FIG. 1B, FIG. 1C, and FIG. 1D may be referred to as a data state A, a data state B, a data state C, and a data state D, respectively.

The threshold level of the data state A may be the lowest, and the threshold level of the data state D may be the highest. For example, the threshold of the data state A may be lower than a first level Va. The threshold of the data state B may be in between the first level Va and a second level Vb that is higher than the first level Va. The threshold of the data state C may be in between the second level Vb and a third level Vc that is higher than the second level Vb. The threshold of the data state D may be higher than the third level Vc.

The data states A, B, C, and D of the non-volatile semiconductor memory device may be assigned with two bits of data "1/1", "0/1", "0/0", and "1/0", respectively. Of the two bits of data "b1/b0", the bit b0 may be used as a data bit and the bit b1 may be used as an error correction bit. Of the four data states, the data state A having the lowest threshold level and the data state D having the highest threshold level may each have the error correction bit b1 that is assigned with "1", and the data states B and C having two middle threshold levels may each have the error correction bit b1 that is assigned with "0".

The error correction bit of ECC is used for detecting an error in the data bit and resetting the data bit to a normal value. The error correction bit may be used before the occurrence of a data bit error for resetting the state of a memory transistor to a state where errors may not easily occur.

When writing data, "1" is written in the error correction bit b1. Accordingly, when there is no bit error, for example, in a normal mode, "1" is set to the error correction bit b1. The state where "1" is set to the error correction bit b1 may be referred to as a "normal" state. The state where "0" is set to the error correction bit b1 may be referred to as an "abnormal" state. The error correction bit b1 may have one of two values, "normal" and "abnormal".

In FIGS. 1A-1D, the error correction bits b1 of the data states A and D are assigned with "1", and the error correction bits b1 of the data states B and C are assigned with "0". Alternatively, the error correction bits b1 of the data states A and D may be assigned with "0", and the error correction bits b1 of the data states B and C may be assigned with "1". The state where the error correction bit b1 is set to "0" may correspond to the "normal" state, and the state where the error correction bit b1 is set to "1" may correspond to the "abnormal" state.

In a memory cell in the data state D, the electrical charge stored in the floating gate 24 may leak to the substrate, etc. due to the data retention, and the threshold may decrease. When the threshold decrease to a value less than the third level Vc, which separates the data state C and the data state D, the data state may transit from the data state D to the data state C.

In a memory cell in the data state A, an unexpected electrical charge may be injected into the floating gate 24 due to the read disturb and the program disturb. As a result, the threshold of the floating gate FET increases. When the threshold increases to a value higher than the first level Va, which separates the data state A and the data state B, the data state may transit from the data state A to the data state B.

In the non-volatile semiconductor memory device, a controller packaged together with the memory cells reads a value of the error correction bit b1 at a regular interval. When the value read is "0(abnormal)", the value of the error correction bit b1 is reset to "1(normal)", or refreshed for example. As a result, the memory cell, which is in the data state B when reading the value therefrom, may return to the data state A. The memory cell, which is in the data state C when reading the value therefrom, may return to the data state D. The abnormal state may return to the normal state without changing a value of the data bit b0 indicating the abnormal state.

Figure 2:
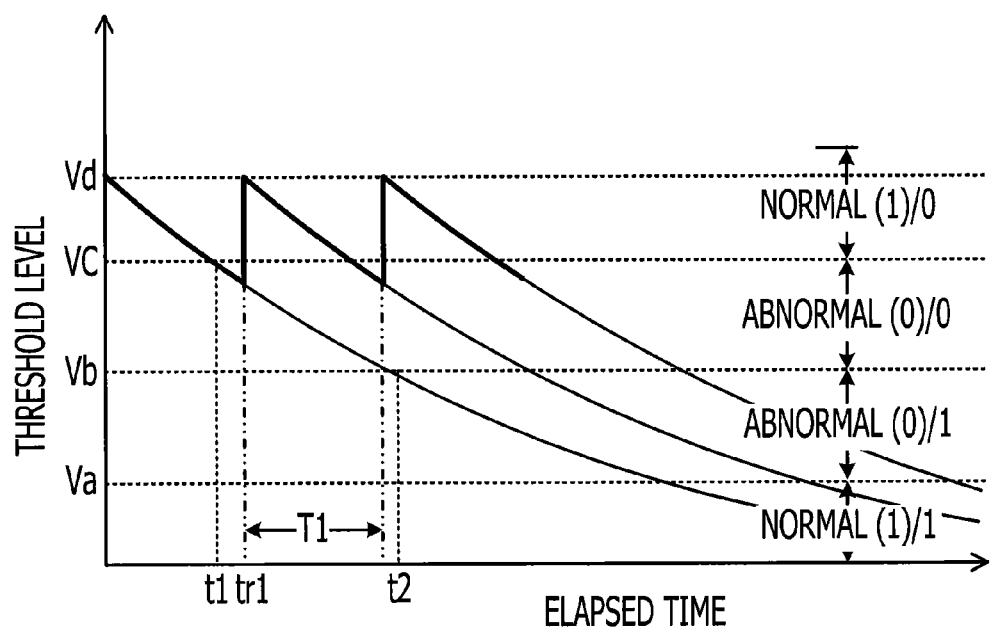
FIG. 2 illustrates an exemplary threshold of a memory cell.

FIG. 2 illustrates an exemplary threshold of a memory cell. FIG. 2 may illustrate a temporal variation in the threshold (dependent on a stored amount of electrical charge) of a memory cell in the data state D. The horizontal axis represents an elapsed time, and the vertical axis represents the threshold level. A region where the threshold is lower than the first level Va may correspond to the data state A, for example, b1/b0="1(normal)/1". A region where the threshold is higher than the first level Va and lower than the second level Vb may correspond to the data state B, for example, b1/b0="0(abnormal)/1". A region where the threshold is higher than the second level Vb and lower than the third level Vc may correspond to the data state C, for example, b1/b0="0(abnormal)/0". A region where the threshold is higher than the third level Vc may correspond to the data state D, for example, b1/b0="1(normal)/0".

In an initial state, the threshold of a memory cell in the data state D is set to Vd. The threshold of the memory cell may decrease with the passage of time due to the data retention. At time t1, the threshold of the memory cell decreases to the third level Vc. After the time t1, the threshold of the memory cell becomes lower than the third level Vc, and thus the memory cell transits to the data state C. At time tr1, when a refresh operation is initiated, the error correction bit b1 of the memory cell is reset from "0(abnormal)" to "1(normal)". At this time, the data bit b0 may not be rewritten. Accordingly, the value of the memory cell is reset to b1/b0="1(normal)/0", and the threshold returns to the initial value Vd. After that, the refresh operation is performed regularly at a cycle Ti to reset the threshold of the memory cell to the initial value Vd. The data bit b0 may have less bit errors.

On the other hand, when no refresh operation is performed at the time tr1, the threshold of the memory cell may decrease to the second level Vb at time t2. After the time t2, the threshold of the memory cell becomes less than the second level Vb, and the memory cell may transit to the data state B, for example, the stored value may become a state where b1/b0="0(abnormal)/1". If the refresh operation is performed at this state, the value of the memory cell may be reset to "1(normal)/1". The value of the data bit b0 may be rewritten. To reduce the occurrences of bit errors in the data bit b0, the refresh cycle Ti may be set to a period that is shorter than the time it takes the threshold of the memory cell in the data state D to decrease from the initial value Vd to the second level Vb.

When the error correction bit b1 of a memory cell that stores the value b1/b0="1(normal)/1" changes to "0(abnormal)", the refresh operation of the memory cell now storing the value b1/b0="0(abnormal)/1" may be performed to return the value of the memory cell to the original value. For example, as illustrated in FIG. 2, when the refresh operation is performed after the time t2, the value of the memory cell does not return to the original value, and an error may occur in the data bit b0.

Figure 3:
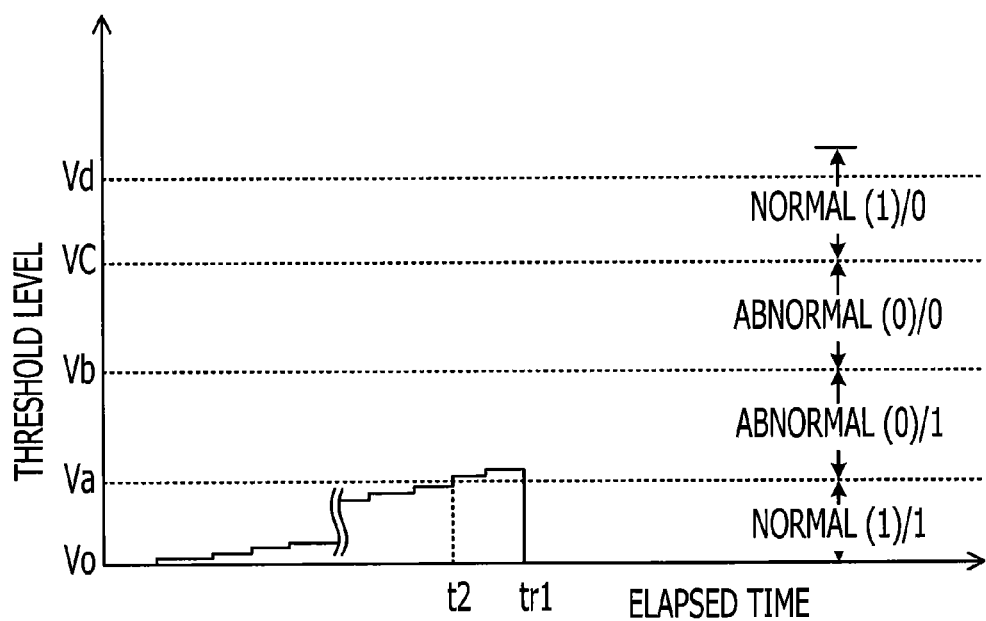
FIG. 3 illustrates an exemplary threshold of a memory cell.

FIG. 3 illustrates an exemplary threshold of a memory cell. FIG. 3 may illustrate a temporal variation in the threshold of a memory cell in the data state A. The horizontal axis illustrated in FIG. 3 represents the elapsed time, and the vertical axis represents the threshold level. The threshold of a memory cell in the data state A is set to an initial value Vo. The threshold value of the memory cell increases every time the read disturb or the program disturb occurs. As the increase of the threshold value is repeated, the threshold value reaches the first level Va at time t2. After the time t2, the memory cell may transit to the data state B, for example, the value of the memory cell may change to b1/b0="0(abnormal)/1".

At time tr1, when the refresh operation is performed, the error correction bit b1 of the memory cell is reset from the "0(abnormal)" to "1(normal)". The threshold of the memory cell may return to the initial value Vo. Since the refresh operation is performed before the threshold of the memory cell exceeds the second level Vb, the data bit b0 may have less bit errors.

Each memory cell may store four-valued data, for example, two bits of data. The non-volatile semiconductor memory device may store multi-valued data other than the four-valued data, such as three bits or four bits of data, etc. For example, as illustrated in FIGS. 1A-1D, when a plurality of data states are lined up in order of the threshold level, the data states A and D out of the four successive data states A-D, which have the lowest and highest threshold level respectively, may have the error correction bit b1 that is assigned to "normal", and the data states B and C, which have two middle threshold levels between those lowest and highest threshold levels, may have the error correction bit b1 that is assigned to "abnormal".

The data state that has been changed to the abnormal state due to the change in the threshold thereof may be brought back to the nearest normal data state.

The memory cell may include a floating gate FET or a device that has a characteristic of varying its threshold in response to a disturbance. For example, the memory cell may include a SONOS FET or a phase change RAM (PRAM).

A storage capacity of the non-volatile semiconductor memory device may be substantially the same as that of a single level cell (SLC). The SLC may perform a "1/0" determination of data bit by using a single determination threshold. The state may not be detected even when a threshold of a memory cell changes to a value close to the determination threshold. As a result, a bit error may occur.

The threshold is reset to the initial value before the threshold changes to a point where a correction thereof may not be possible. Accordingly, less bit errors may occur.

Figure 4:
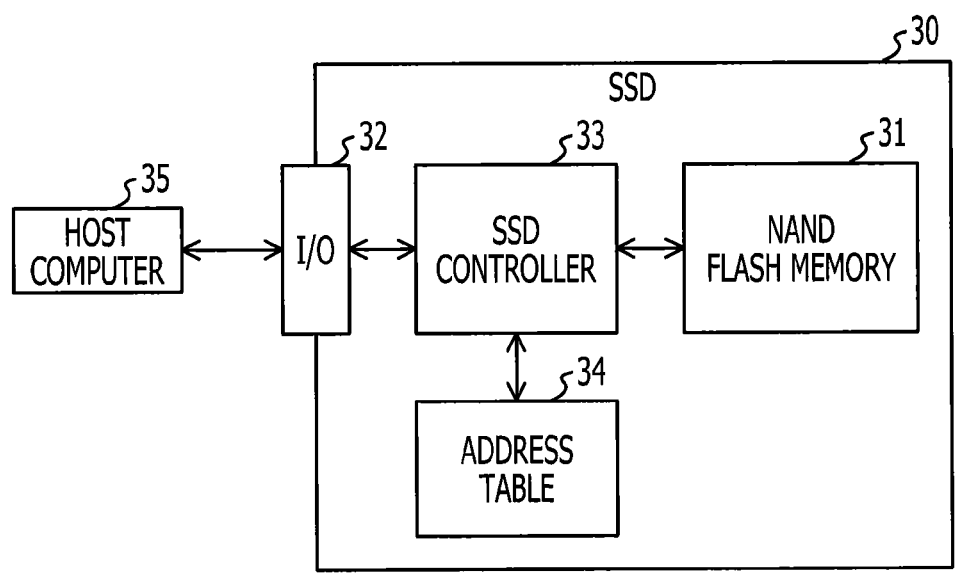
FIG. 4 illustrates an exemplary solid state drive (SSD)

FIG. 4 illustrates an exemplary solid state drive (SSD). The SSD illustrated in FIG. 4 may use a NAND flash memory.

The SSD 30 includes a memory circuit 31, an input/output interface 32, a SSD controller 33, and an address table 34. The memory circuit 31 includes a NAND flash memory. The SSD 30 is coupled to a host computer 35 via the input/output interface 32. The host computer 35 sends logical addresses with a data read command or a data write command to the SSD 30. The address table 34 stores a mapping between the logical addresses and page addresses (physical addresses).

The SSD controller 33 obtains the page addresses from the logical addresses by referring to the address table 34 based on the command from the host computer 35. The SSD controller 33 accesses the memory circuit 31 based on the page addresses thus obtained.

Figure 5:
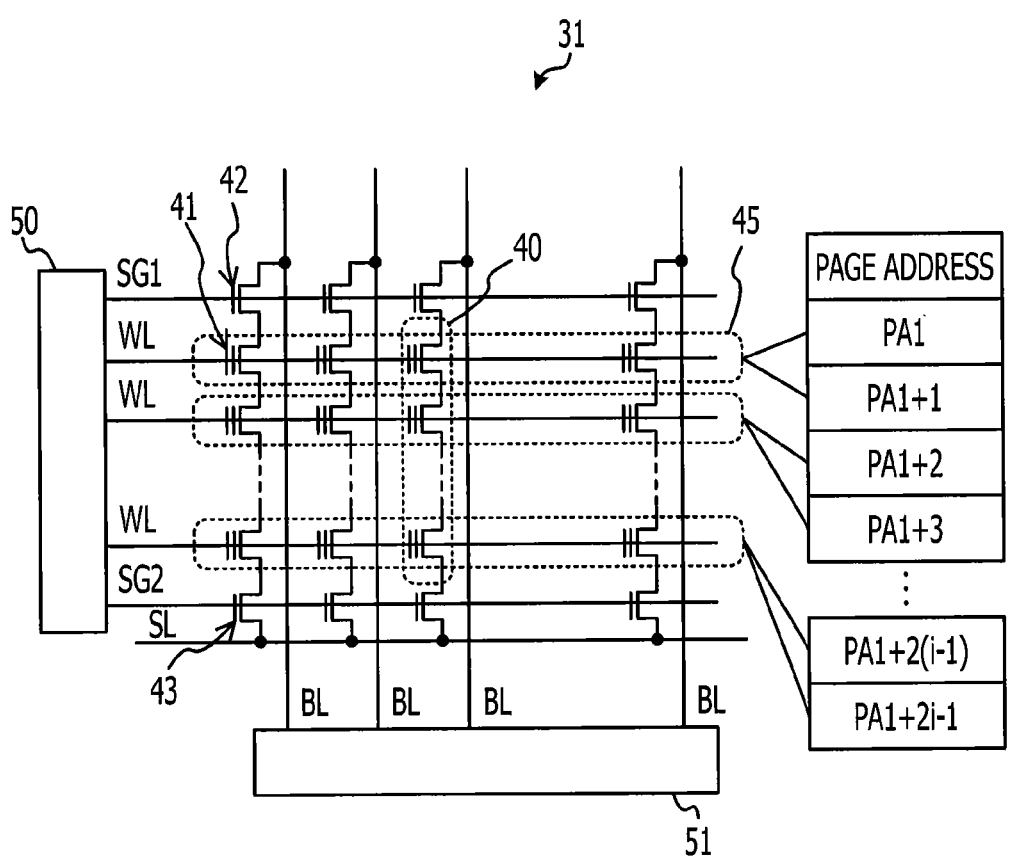
FIG. 5 illustrates an exemplary memory circuit.

FIG. 5 illustrates an exemplary memory circuit. FIG. 5 illustrates an equivalent circuit of the memory circuit 31 including a NAND flash memory. A NAND cell unit 40 includes a plurality of memory cells 41 that are arranged in a column direction illustrated in FIG. 5 and directly coupled to each other. Each of the memory cells 41 may include the floating gate FET illustrated in FIGS. 1A-1D, for example. In FIG. 5, a plurality of the NAND cell units 40 is arranged in a row direction and the memory cells 41 are arranged in a matrix array.

Word lines WL are arranged for their respective rows of the memory cells 41. Control gates of the memory cells 41 are coupled to the word line WL in the corresponding row. Bit lines BL are arranged for their respective NAND cell units 40. One end of each NAND cell unit 40 is coupled to the corresponding bit line BL via a first selection transistor 42. Gates of a plurality of the first selection transistors 42 are connected to a single first selection gate line SG1. The other ends of the NAND cell units 40 are coupled to a single source line SL via second selection transistors 43. Gates of the second selection transistors 43 are coupled to a single second selection gate line SG2.

A line decoder 50 selects one word line WL from the plurality of the word lines WL. The bit lines BL are coupled to a page buffer 51. Data is read out from memory cells 41 coupled to a selected word line, and temporarily stored in the page buffer 51 via the bit line BL.

One line of memory cells 41 coupled to the same word line WL, for example, a memory cell group 45 may be assigned with two page addresses (physical addresses). For example, a memory cell group 45 in the first line may be assigned with page addresses PA and PA1+1. A memory cell group 45 in the i-th line may be assigned with page addresses PA1+2(i−1) and PA1+2i−1.

The memory cell groups 45 may be each assigned with two continuous page addresses. Alternatively, the memory cell groups 45 may be each assigned with two non-continuous page addresses.

FIGS. 6A and 6B illustrate an exemplary address mapping. FIG. 6A may illustrate a mapping between the logical addresses and the page addresses stored in the address table 34 illustrated in FIG. 4. A plurality of the logical addresses, for example, eight logical addresses may be grouped together, and the mapping between such a group of the logical addresses and a corresponding group of the page addresses may be stored in the address table 34. The logical addresses and the page addresses may be in one-to-one correspondence, or one-to-two correspondence. For example, in FIG. 6A, logical addresses LA1 to LA1+7 correspond to page addresses PA1 to PA1+15.

FIG. 6B illustrates a mapping between the logical addresses LA1 to LA1+7 and the page addresses PA1 to PA1+15. Two page addresses including a first page address and a second page address correspond to one logical address. The first page address and the second page address, which correspond to one logical address, may be assigned to the same memory cell group 45. For example, the first page address PA1+1 and the second page address PA1 correspond to the logical address LA1. The first page address and the second page address designate the data bit b0 and the error correction bit b1 (FIGS. 1A-1D) of the memory cell 41, respectively.

Figure 7:
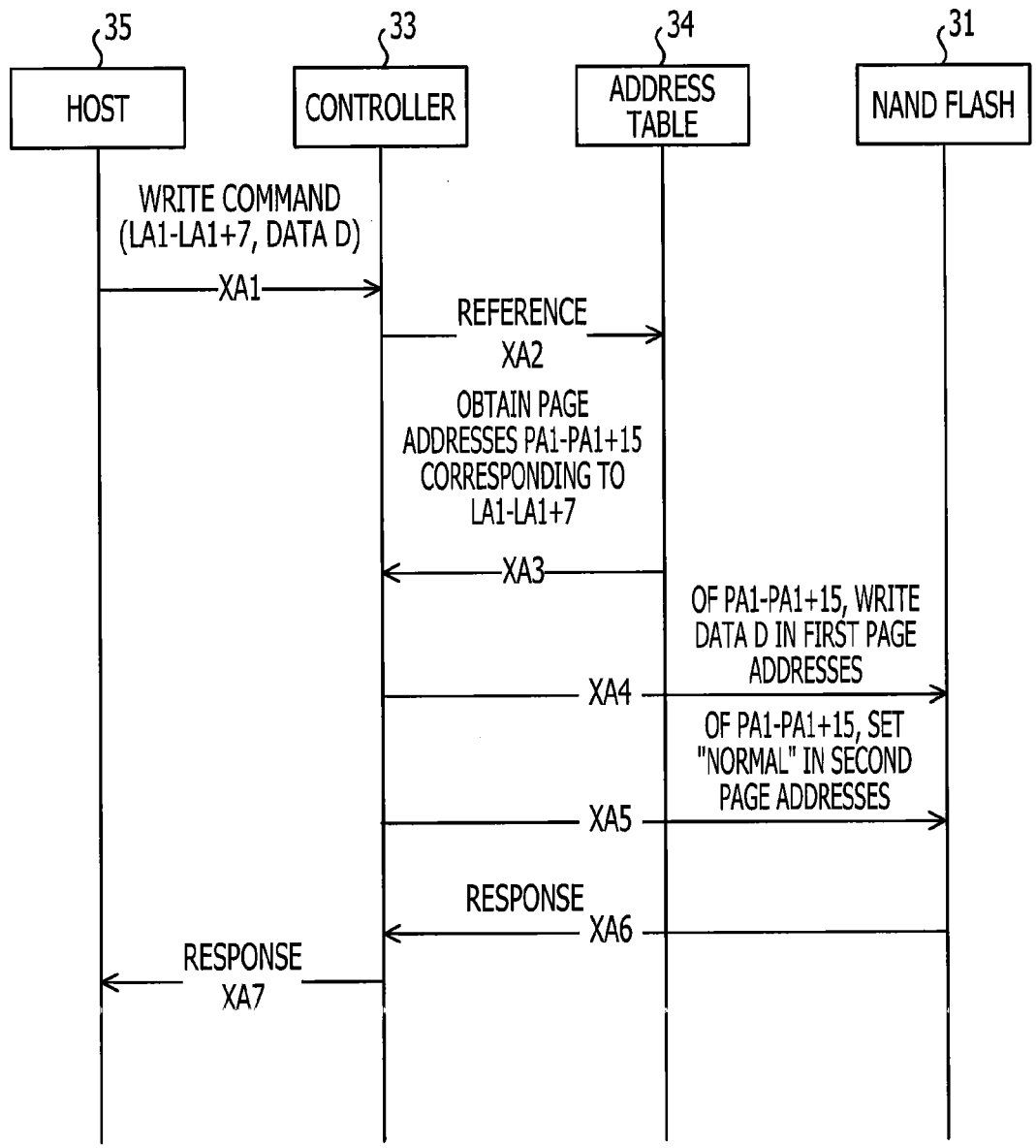
FIG. 7 illustrates an exemplary data write method.

FIG. 7 illustrates an exemplary data write method. The host computer 35 sends a write command (M1) that designates LA1 to LA1+7 as write logical addresses and data D as write data to the SSD controller 33. The SSD controller 33 obtains page addresses (XA3) available for writing by referring to the address table 34 (XA2). The logical addresses LA1 to LA1+7 are matched with newly obtained page addresses PA1 to PA1+15. Old page addresses that were previously associated with the logical addresses LA1 to LA1+7 are released.

The SSD controller 33 writes the data D (XA4), which is specified in the write command from the host computer 35, into memory cell groups 45 designated by the first page addresses, for example, PA1+2i+1 (i is an integer of 0-7) out of the page addresses PA1 to PA1+15 of the memory unit 31. The SSD controller 33 writes "1(normal)" (XA5) into memory cell groups 45 designated by the second page addresses, for example, PA1+2i (i is an integer of 0-7) out of the page addresses PA1 to PA1+15. The memory cell groups 45 to which the data D is written and the memory cell groups 45 to which "1(normal)" is written may be the same memory cell groups. Upon receiving a write complete response (XA6) from the memory unit 31, the SSD controller 33 sends a response signal (XA7) indicating the write complete to the host computer 35.

At the completion of write operation, each of the memory cells 41 may be set to the data state A illustrated in FIG. 1A or the data state D illustrated in FIG. 1D.

Figure 8:
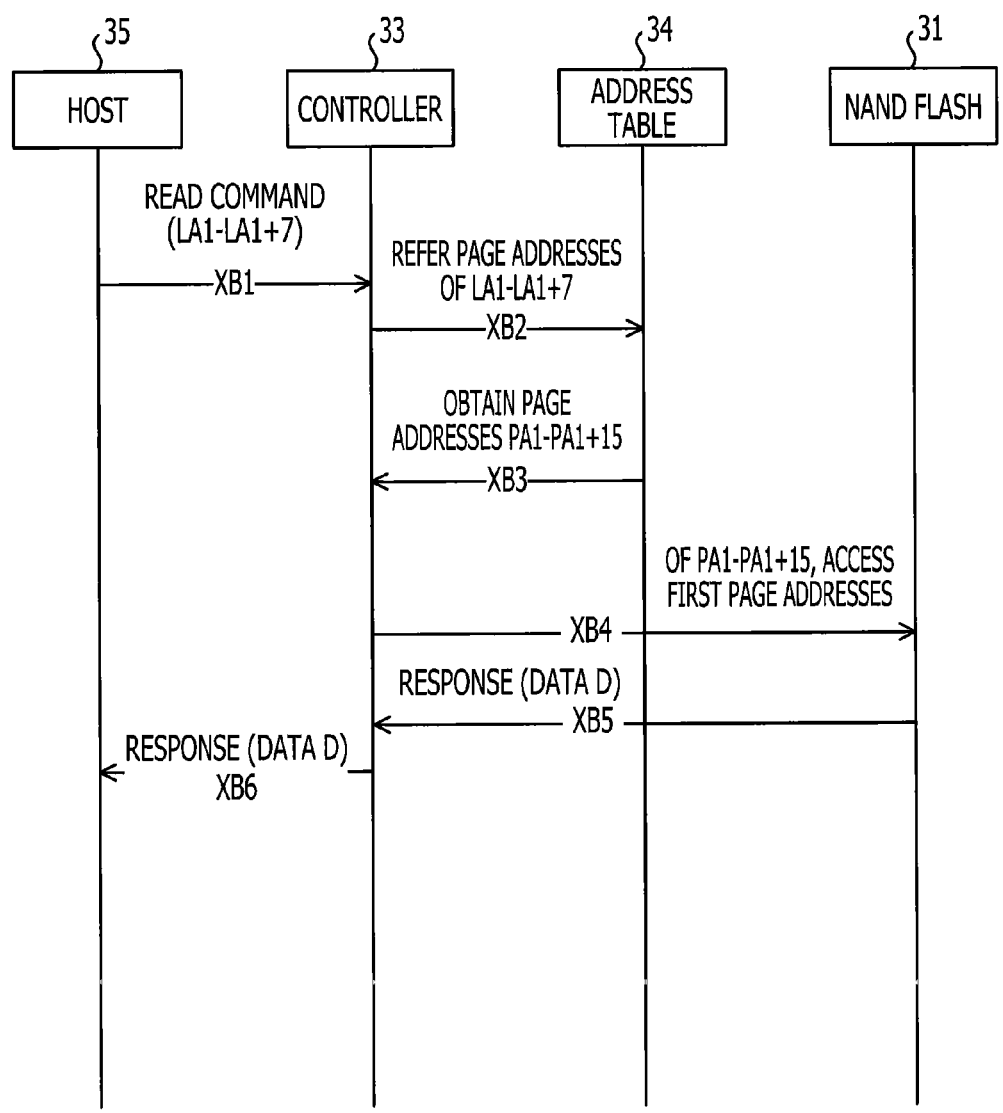
FIG. 8 illustrates an exemplary data read method.

FIG. 8 illustrates an exemplary data read method. The host computer 35 sends a read command (XB1) that designates LA1 to LA1+7 as read logical addresses to the SSD controller 33. The SSD controller 33 obtains page addresses (XB3) corresponding to the logical addresses LA1 to LA1+7 by referring to the address table 34 (XB2).

The SSD controller 33 accesses memory cell groups 45 (XB4) of the first page addresses, for example, PA1+2i+1 (i is an integer of 0-7) out of the page addresses PA1 to PA1+15 of the memory unit 31, and reads data D (XB5). The SSD controller 33 sends a response signal (XB6) including the data D read to the host computer 35.

During the data read operation, no access may be made to the second page addresses of the page addresses PA1 to PA1+15. No error correction based on ECC may be performed. As a result, a high speed read operation may be performed.

Figure 9:
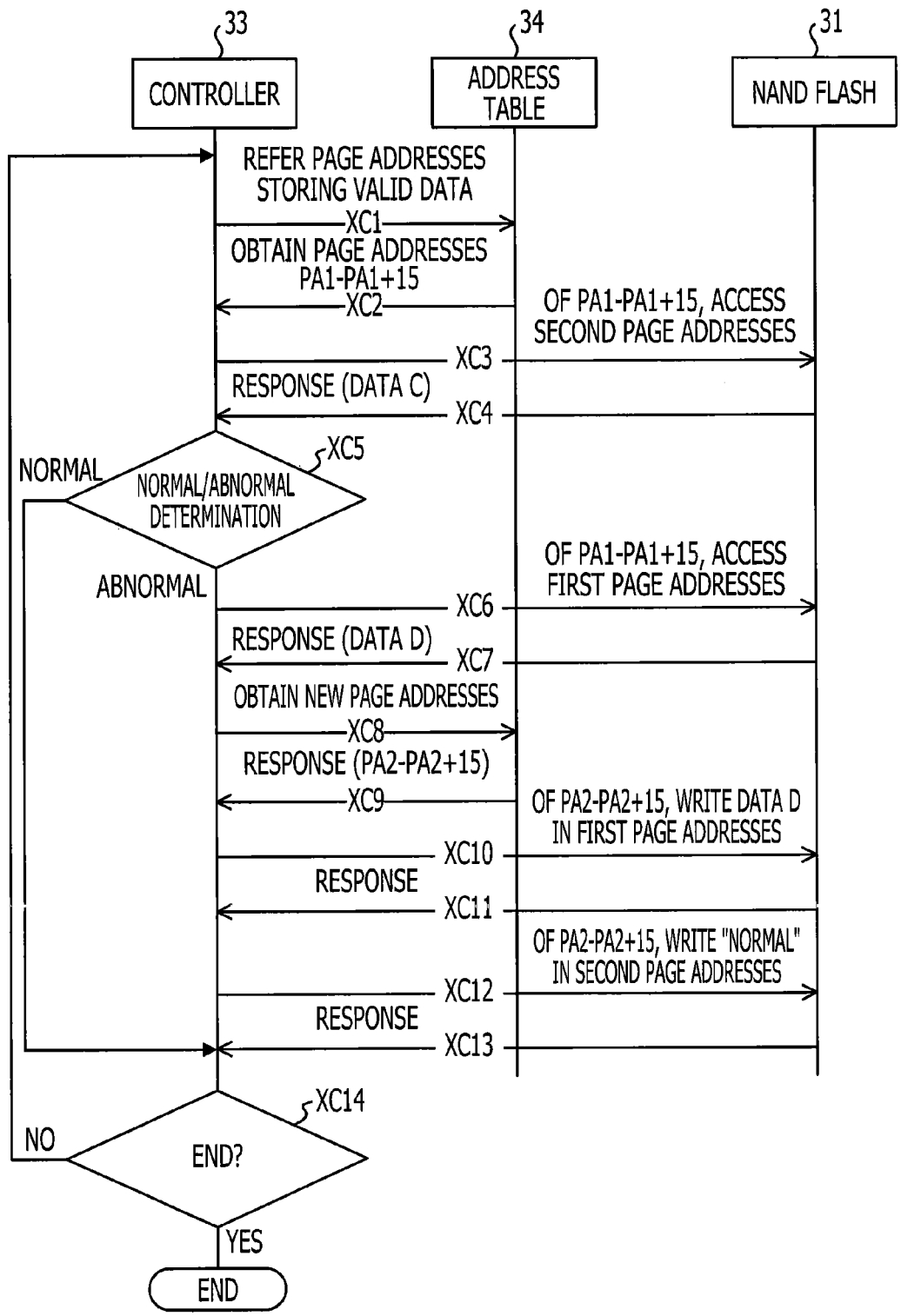
FIG. 9 illustrates an exemplary refresh operation.

FIG. 9 illustrates an exemplary refresh operation. The SSD controller 33 autonomously performs the refresh operation without receiving a command from the host computer 35

(FIG. 4). For example, the refresh operation may be performed regularly at a certain cycle.

When the refresh operation is initiated, the SSD controller 33 obtains page addresses (XC2) in which valid data is stored by referring to the address table 34 (XC1). For example, page addresses PA1 to PA1+15 may be obtained from the address table 34. The SSD controller 33 accesses the second page addresses, for example, PA1+2i (i is an integer of 0-7) out of the page addresses PA1 to PA1+15(XC3), and reads data from the memory unit 31 (XC4). It is determined whether or not data C read from the memory unit 31 to the SSD controller 33 is normal (XC5). It may be determined as normal when every bit of the data C is "1(normal)", for example, when a value of every bit read from all memory cells 41 included in a memory cell group 45 (FIG. 5) that is a target for reading is "1(normal)", for example. It may be determined as abnormal, for example, when any one of the bits is found to be "0(abnormal)".

Based on a determination result indicating normal, the SSD controller 33 determines whether or not to end the refresh operation (XC14). Based on a determination result indicating abnormal, the SSD controller 33 accesses the first page addresses of the page addresses PA1 to PA1+15 of the memory unit 31 (XC6), and reads data (XC7). The read data may be, for example, the data D. The data D may include every bit read from all the memory cells 41 included in the memory cell group 45 (FIG. 5) that is the target for reading.

The SSD controller 33 accesses the address table 34 (XC8), and obtains new page addresses (XC9) for new writing. The new page addresses may be, for example, PA2 to PA2+15. Old page addresses PA1 to PA1+15 may be released. The data D may be written in the first page addresses, for example, the page addresses PA2+2i+1 (i is an integer of 0-7) out of the new page addresses PA2 to PA2+15 (XC10). When the SSD controller 33 receives a write complete message (XC11) from the memory unit 31, "1(normal)" is written in the second page addresses, for example, the page addresses PA2+2i (i is an integer of 0-7) out of the new page addresses PA2 to PA2+15 (XC12).

Upon receiving the write compete message from the memory unit 31 (XC13), the SSD controller 33 determines whether or not to end the refresh operation (XC14). When all the above processes end for all the page addresses in which valid data is stored, the refresh operation of the current cycle ends. When there is any page address as to which the refresh operation has not been completed, the refresh operation may be repeated until the refresh operation is completed for all valid page addresses.

The memory cell 41 in the page addresses in which valid data is stored may be set to the data state A illustrated in FIG. 1A or the data state D illustrated in FIG. 1D. For example, when a memory cell 41 is detected to be the data state B illustrated in FIG. 1B or the data state C illustrated in FIG. 1C during the refresh operation, the detected memory cell 41 is reset to the data state A illustrated in FIG. 1A or the data state D illustrated in FIG. 1D. Accordingly, the data bit b0 may have less bit errors.

Since no ECC circuit is prepared, an increase in a chip size and an increase in delay time due to ECC decoding and coding may be reduced. An error correction operation by ECC may be used together. Since high reliability is ensured, an ECC redundancy may be reduced.

Figure 10:
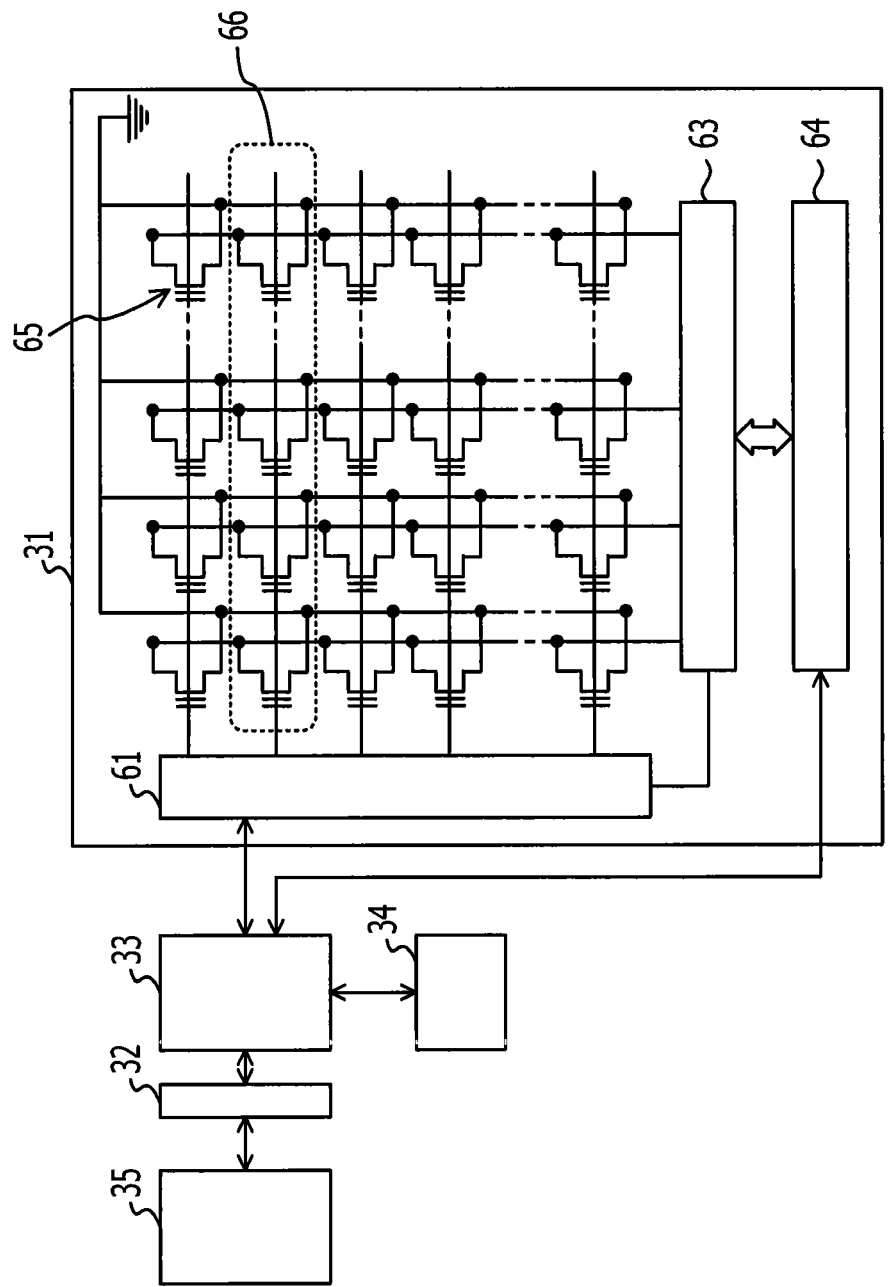
FIG. 10 illustrates an exemplary non-volatile semiconductor memory device.

FIG. 10 illustrates an exemplary non-volatile semiconductor memory device. In FIG. 10, the same reference numerals denote elements substantially identical or similar to those of FIG. 5, and descriptions thereof may be omitted or reduced.

A memory unit 31 illustrated in FIG. 10 may be a NOR flash memory. In FIG. 10, an input/output interface 32, a SSD controller 33, and an address table 34 may be prepared.

The memory unit 31 includes a line decoder 61, an input/output buffer 63, a read/write circuit 64, and memory cells 65 arranged in a matrix array. Each of the memory cells 65 may be the floating gate FET illustrated in FIGS. 1A-1D, for example. A memory cell group 66 including one line of the memory cells 65 may be assigned with two physical addresses, for example. In the address table 34, one logical address may correspond to two physical addresses which are assigned to a single memory cell group 66. One of the physical addresses out of the two physical addresses, for example, a first physical address designates the data bit 0 illustrated in FIGS. 1A-1D, and the other, for example, a second physical address designates the error correction bit b1 illustrated in FIGS. 1A-1D.

In a write operation, the SSD controller 33 obtains the first and second physical addresses corresponding to a logical address that corresponds to a write command. The SSD controller 33 changes the states of memory cells 65, which are included in a memory cell group 66 designated by the first and second physical addresses, to an erased state. The SSD controller 33 writes data in the first physical address, and resets all the error correction bits in the second physical address to "normal".

In a read operation, the SSD controller 33 obtains the first physical address corresponding to a logical address that corresponds to a read command. The SSD controller 33 reads data from memory cells 65, which are included in a memory cell group 66 designated by the first physical address. The SSD controller 33 sends the read data to a host computer 35.

In a refresh operation, the SSD controller 33 regularly reads data of the error correction bits b1 designated by the second physical address in each memory cell group 66. When one or more of the error correction bits b1 read from a memory cell group 66 are "abnormal", the SSD controller 33 reads data of the first physical address of the memory cell group 66 and stores the read data in a temporary storage area in the SSD controller 33.

The SSD controller 33 changes the states of memory cells 65 in the memory cell group 66 to the erased state. The SSD controller 33 writes in the first physical address the data stored in the temporary storage area, and sets all the error correction bits b1 in the second physical address to "normal".

In the memory unit 31 including a NOR flash memory, the memory cells 65 may be erased by line. Accordingly, when an abnormal state memory cell is detected during the refresh operation, rewriting of data may be performed in a physical address in which the abnormal state memory cell is detected, without obtaining new physical address.

It may forestall an occurrence of bit error in data bits.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-volatile semiconductor memory device comprising:
a memory unit including a plurality of memory cells, each of the plurality of memory cells to perform a multi-level storage operation by assigning a value including a plurality of bits to at least four data states defined according to a threshold level; and
a controller to control the memory unit, wherein the controller
sets at least one of the plurality of bits to an error correction bit that indicates one of a first state and a second state;
assigns the first state to the error correction bit that corresponds to the data states having a minimum threshold level and a maximum threshold level and the second state to the error correction bit that corresponds to the data states having other threshold level;
sets the error correction bit to the first state when writing data in at least one of the plurality of memory cells; and
resets the error correction bit to the first state if the error correction bit indicates the second state when reading the error correction bit periodically.

2. The non-volatile semiconductor memory device according to claim 1, wherein the first state indicates a normal state and the second state indicates an abnormal state.

3. The non-volatile semiconductor memory device according to claim 1, wherein the controller sets the other bit, which is included in the plurality of bits and is other than the at least one of the plurality of bits, to a data bit.

4. The non-volatile semiconductor memory device according to claim 1, wherein the memory unit includes a plurality of memory cell groups, each of the plurality of memory cell groups being a unit of reading and including a plurality of memory cells; and each of the plurality of memory cell groups is assigned with at least two page addresses including a first page address designating data bits and a second page address designating the error correction bits.

5. The non-volatile semiconductor memory device according to claim 1, wherein the memory unit is a NAND flash memory.

6. The non-volatile semiconductor memory device according to claim 4, wherein when at least one of a plurality of memory cells, which corresponds to the second page address of a first memory cell group of the plurality of memory cell groups, is in the second state, the controller reads data in the first page address of the first memory cell group, writes the data in the first page address of a second memory cell group of the plurality of memory cell groups, and sets a plurality of memory cells in the second page address of the second memory cell group to the first state.

7. The non-volatile semiconductor memory device according to claim 4, further comprising: an address table of associated logical addresses given externally with the first page addresses.

8. The non-volatile semiconductor memory device according to claim 7 wherein the controller writes data in the first page address corresponding to the logical address obtained from the address table, and sets a plurality of memory cells in the second page address to the first state, the second address being assigned to the memory cell group that corresponds to the first page address.

9. The non-volatile semiconductor memory device according to claim 7 wherein the controller reads data from the first page address corresponding to the logical address obtained from the address table.

10. The non-volatile semiconductor memory device according to claim 1 wherein each of the plurality of memory cells includes a floating gate transistor, and a state of the memory cell is determined in response to an amount of electrical charge stored in a floating gate.

* * * * *